United States Patent
Young et al.

(10) Patent No.: US 10,825,772 B2
(45) Date of Patent: Nov. 3, 2020

(54) REDUNDANCY SCHEME FOR MULTI-CHIP STACKED DEVICES

(71) Applicant: XILINX, INC., San Jose, CA (US)

(72) Inventors: Steven P. Young, Boulder, CO (US); Brian C. Gaide, Erie, CO (US)

( * ) Notice: Subject to any disclaimer, the term of this patent is extended or adjusted under 35 U.S.C. 154(b) by 0 days.

(21) Appl. No.: 16/571,788

(22) Filed: Sep. 16, 2019

(65) Prior Publication Data

US 2020/0303311 A1    Sep. 24, 2020

Related U.S. Application Data

(63) Continuation-in-part of application No. 15/967,109, filed on Apr. 30, 2018.

(51) Int. Cl.
*H01L 23/538* (2006.01)
*H01L 21/66* (2006.01)
*H01L 25/065* (2006.01)

(52) U.S. Cl.
CPC .......... *H01L 23/5382* (2013.01); *H01L 22/22* (2013.01); *H01L 25/0657* (2013.01)

(58) Field of Classification Search
USPC .......................................................... 716/131
See application file for complete search history.

(56) References Cited

U.S. PATENT DOCUMENTS

| | | | |
|---|---|---|---|
| 9,607,948 B2 | 3/2017 | Karp et al. | |
| 2012/0256653 A1* | 10/2012 | Cordero | H03K 19/17796 326/16 |
| 2014/0062587 A1* | 3/2014 | Koyanagi | G06F 3/0688 327/595 |
| 2014/0282890 A1 | 9/2014 | Li et al. | |
| 2015/0162311 A1* | 6/2015 | Bartley | G06F 1/04 327/565 |

FOREIGN PATENT DOCUMENTS

| | | |
|---|---|---|
| TW | M583622 U | 9/2019 |
| WO | WO-2015060913 A1 | 4/2015 |

* cited by examiner

*Primary Examiner* — Eric D Lee
(74) *Attorney, Agent, or Firm* — Patterson + Sheridan, LLP

(57) ABSTRACT

Some examples described herein relate to redundancy in a multi-chip stacked device. An example described herein is a multi-chip device. The multi-chip device includes a chip stack including vertically stacked chips. Neighboring pairs of the chips are directly connected together. Each of two or more of the chips includes a processing integrated circuit. The chip stack is configurable to operate a subset of functionality of the processing integrated circuits of the two or more of the chips when any portion of the processing integrated circuits is defective.

19 Claims, 6 Drawing Sheets

US 10,825,772 B2

REDUNDANCY SCHEME FOR MULTI-CHIP STACKED DEVICES

CROSS-REFERENCE TO RELATED APPLICATIONS

This application is a continuation-in-part of U.S. patent application Ser. No. 15/967,109, filed on Apr. 30, 2018, and entitled "REDUNDANCY SCHEME FOR A 3D STACKED DEVICE," the entire disclosure of which is incorporated herein by reference.

TECHNICAL FIELD

Examples of the present disclosure generally relate to redundancy in a multi-chip stacked device containing stacked chips.

BACKGROUND

In some multi-chip devices, chips of a field programmable gate array (FPGA) can be packaged to form a package where the chips are disposed on a common substrate or interposer. The chips can be attached in a side-by-side manner to the same surface of the interposer. The interposer is typically passive (e.g., does not include active components such as transistors) and includes data paths for coupling the chips to each other.

Due to a manufacturing defect, one or more chips to be incorporated into a multi-chip device may be nonfunctional. In the foregoing example of a multi-chip device, defective chips can be identified and discarded before being attached on an interposer. In developing technologies of multi-chip stacked devices, under some circumstances, even if identified, a defective chip may be incorporated into a multi-chip stacked device, which can result in reduced yield of multi-chip stacked devices that are manufactured since any defective chip in a multi-chip stacked device can cause the multi-chip stacked device to be defective.

SUMMARY

Examples described herein relate to redundancy in a multi-chip stacked device. A multi-chip device can be manufactured according to a device specification that includes, e.g., each of the chips of the multi-chip device being operable to meet the device specification. The multi-chip device can be configurable such that the multi-chip device is operable according to another device specification, e.g., a device specification having fewer, yet common, chips (or portions thereof) that are operable. In such examples, defective multi-chip devices that are manufactured according to one specification can be recovered to operate according to a different specification. Further examples describe techniques for realizing multi-chip devices based on the ability to recover defective devices.

An example described herein is a multi-chip device. The multi-chip device includes a chip stack including vertically stacked chips. Neighboring pairs of the chips are directly connected together. Each of two or more of the chips includes a processing integrated circuit. The chip stack is configurable to operate a subset of functionality of the processing integrated circuits of the two or more of the chips when any portion of the processing integrated circuits is defective.

Another example described herein is a method for realizing a device. A chip stack is configured to operate a subset of functionality of a plurality of processing integrated circuits when any portion of the processing integrated circuits is defective. The chip stack includes vertically stacked chips. Neighboring pairs of the chips are directly connected together. Each of two or more of the chips includes a respective one of the processing integrated circuits.

Another example described herein is a multi-chip device. The multi-chip device includes a chip stack comprising chips. Each of the chips includes an integrated circuit. At least one of the chips includes an integrated circuit comprising a programmable logic region. The chip stack is configurable to operate respective entireties of all of the chips of the chip stack and is configurable to operate less than entireties of all of the chips of the chips stack. When the chip stack is configured to operate less than entireties of all of the chips of the chip stack, at least a portion of the programmable logic region of the at least one of the chips having the integrated circuit comprising the programmable logic region is operable. The chip stack is operable to load and operate configuration data, and the configuration data is operable on one or more programmable logic region of the chip stack. The chip stack is configurable to operate the configuration data regardless of which portions of the chips the chip stack is configured to operate.

Another example described herein is a method for realizing a device. A multi-chip device including a chip stack of chips is tested. Each of the chips includes a processing integrated circuit. The multi-chip device is manufactured according to a first device specification. Whether the multi-chip device is operable according to the first device specification or a second device specification different from the first device specification is determined based on testing the multi-chip device. The multi-chip device is programmed to be operable according to one of the first device specification and the second device specification based on the determining.

An additional example describe herein is a method for realizing a device. A multi-chip stack device is manufactured according to a first specification. The first specification includes a first number of chips. The first number of chips includes at least one chip comprising an integrated circuit comprising a programmable logic region. The multi-chip stack device is tested. The multi-chip stack device is configured to be operable according to the first specification or a second specification. The second specification includes a second number of chips less than the first number of chips. The second number of chips includes at least one chip comprising an integrated circuit comprising a programmable logic region.

A further example described herein is a method for manufacturing devices. A first target number of multi-chip devices to be realized according to a first specification and a second target number of multi-chip devices to be realized according to a second specification are obtained. A first manufacture number of multi-chip devices to be manufactured according to the first specification is determined based on the first target number and a first expected yield of manufacturing according to the first specification. A recovered number of expected defective multi-chip devices to be manufactured according to the first specification that are recoverable to at least in part realize the second target number is determined. A second manufacture number of multi-chip devices to be manufactured according to the second specification is determined based on the second target number less the recovered number and based on a second expected yield of manufacturing according to the second specification. The first manufacture number of multi-chip devices is manufactured according to the first specification. The second manufacture number of multi-chip devices is manufactured according to the second specification.

An even further example described herein is a method for manufacturing devices. Respective target numbers of multi-chip devices to be realized according to different specifications are identified. Iteratively until each of the target numbers is fulfilled: (i) a manufacture number of multi-chip devices to be manufactured according to a specification of the specifications that has a highest manufacture cost and has an unfulfilled, remaining target number is determined, and (ii) a respective expected recoverable number of defective multi-chip devices manufactured according to the specification that is recoverable to realize and fulfill, at least in part, the respective target numbers of multi-chip devices of others of the specifications is determined. Determining the manufacture number is based on the unfulfilled, remaining target number and an expected yield of manufacturing according to the specification. The respective manufacture numbers of multi-chip devices are manufactured according to the specifications.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
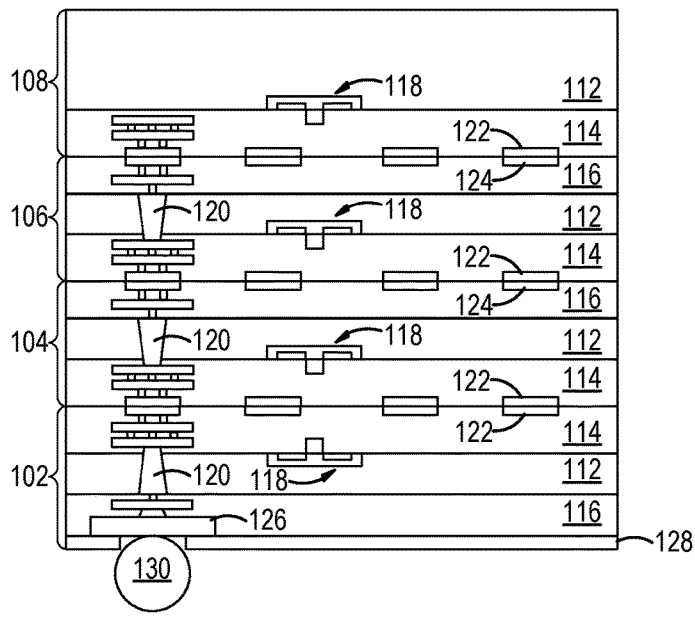
FIG. 1 is a structure of a multi-chip device according to some examples.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Examples described herein relate to redundancy in a multi-chip stacked device. A multi-chip device can include a stack of chips. The multi-chip device can be manufactured according to a device specification that includes, e.g., each of the chips of the multi-chip device being operable to meet the device specification. However, as a result of manufacturing, one or more of the chips of the multi-chip device may be defective, in whole or in part. The multi-chip device can be configurable such that the multi-chip device is operable according to another device specification, e.g., a device specification having fewer, yet the common, chips (or portions thereof) that are operable. In some examples described herein, an entirety of the chip that has a defective portion can be deactivated by configuring the multi-chip device. In some examples, various portions that are defected may be deactivated while other functional portions of a chip are configured to operate by configuring the multi-chip device. In such examples, defective multi-chip devices that are manufactured according to one specification can be recovered to operate according to a different specification.

Some examples describe techniques for realizing multi-chip devices based on the ability to recover defective devices. As indicated, since some multi-chip devices manufactured according to one device specification may be recoverable to operate according to another device specification, the multi-chip devices recovered to be operable according to the other device specification can reduce the number of multi-chip devices manufactured according to the other device specification. Accordingly, manufacturing costs may be reduced by reducing the number of multi-chip devices that are to be manufactured according to the other device specification.

Various examples described herein are described in the context of chips of a multi-chip device having a programmable logic region, such as for a field programmable gate array (FPGA). Concepts described herein can be extended to chips of a multi-chip device having any integrated circuit. For example, redundancy can be implemented when multiple chips have a processor, memory, or any other circuit, which can further be an application specific integrated circuit (ASIC). As used herein, "processing integrated circuit" refers to an integrated circuit comprising a circuit capable of, configured to, and/or configurable to process or manipulate data, as opposed to memory that merely stores data and any circuit ancillary to memory (e.g., a memory controller, an address decoder, etc.). A processing integrated circuit may include memory in addition to a circuit capable of, configured to, and/or configurable to process or manipulate data. Examples of processing integrated circuits include integrated circuits including a programmable logic region (e.g., FPGA), a processor (e.g., a central processing unit (CPU), graphics processing unit (GPU), etc.), an ASIC, the like, or a combination thereof.

FIG. 1 is a structure of a multi-chip device according to some examples. The multi-chip device shown in FIG. 1 is to facilitate description and understanding of aspects of various examples described herein. Various other multi-chip devices can have different structures, different number of chips, additional components, etc.

The multi-chip device includes a first chip 102, a second chip 104, a third chip 106, and a fourth chip 108. Generally, the chips 102-108 are stacked and form a chip stack in the multi-chip device. The chips 102-108 are stacked to form, in some examples, an Active die-on-Active die (AoA) device. In some examples, such as described below, more or fewer chips can be included in the chip stack. For example, one or more of the second chip 104 and/or third chip 106 can be removed or added into a chip stack.

Each of the chips 102-108 includes a semiconductor substrate 112 and front side dielectric layer(s) 114 on a front side of the respective semiconductor substrate 112. The front side dielectric layer(s) 114 include metallization (e.g., metal lines and/or vias) (illustrated but not specifically numbered) formed therein which can electrically connect various components in an integrated circuit. Each of the chips 102-106 includes backside dielectric layer(s) 116 on a backside of the respective semiconductor substrate 112. The backside dielectric layer(s) 116 include metallization (e.g., metal lines and/or vias) (illustrated but not specifically numbered) formed therein which can electrically connect various components in an integrated circuit. Each semiconductor substrate 112 of the chips 102-108 includes, e.g., a transistor 118 formed on and/or in the front side surface of the respective semiconductor substrate 112. The transistor 118 and any other components can be connected to the metallization in the front side dielectric layer(s) 114. Each semiconductor substrate 112 of the respective chip 102-106 has backside through-substrate via(s) (TSV(s)) 120 therethrough, which can electrically connect the metallization in the front side dielectric layer(s) 114 to the metallization in the backside dielectric layer(s) 116 of the respective chip 102-106.

Front side bond pads 122 are formed in the respective front side dielectric layer(s) 114 of the chips 102-108 at an exterior surface distal from the respective semiconductor substrate 112. The front side bond pads 122 are connected to the metallization in the respective front side dielectric layer(s) 114. Backside bond pads 124 are formed in the respective backside dielectric layer(s) 116 of the chips 104, 106 at an exterior surface distal from the respective semiconductor substrate 112. The backside bond pads 124 are connected to the metallization in the respective backside dielectric layer(s) 116.

The chips 102-108 are bonded (e.g., by hybrid bonding using metal-to-metal and oxide-to-oxide bonding) together. The first chip 102 is bonded to the second chip 104 front side to front side such that the front side bond pads 122 and exterior surface of the front side dielectric layer(s) 114 of the first chip 102 are bonded to the front side bond pads 122 and exterior surface of the front side dielectric layer(s) 114 of the second chip 104. The second chip 104 is bonded to the third chip 106 backside to front side such that the backside bond pads 124 and exterior surface of the backside dielectric layer(s) 116 of the second chip 104 are bonded to the front side bond pads 122 and exterior surface of the front side dielectric layer(s) 114 of the third chip 106. The third chip 106 is bonded to the fourth chip 108 backside to front side such that the backside bond pads 124 and exterior surface of the backside dielectric layer(s) 116 of the third chip 106 are bonded to the front side bond pads 122 and exterior surface of the front side dielectric layer(s) 114 of the fourth chip 108.

Other arrangements of bonding can be implemented. In other examples, the chips 102-108 can be attached together using external connectors (such as minibumps, solder, etc.). In some examples, some of the chips 102-108 can be attached together by external connectors while others of the chips can be bonded together without use of external connectors. Any permutation of bonding and use of external connectors can be implemented.

Exterior connector bond pads 126 (e.g., aluminum pads) are formed in the backside dielectric layer(s) 116 of the chip 102 at an exterior surface distal from the semiconductor substrate 112 of the chip 102. The exterior connector bond pads 126 are connected to the metallization in the backside dielectric layer(s) 116 of the chip 102. A passivation layer 128 is formed on the exterior surface distal from the semiconductor substrate 112 of the chip 102 with respective openings therethrough exposing the exterior connector bond pads 126. External connectors 130 (e.g., controlled collapse chip connections (C4), minibumps, etc.) are formed on respective exterior connector bond pads 126 through the openings in the passivation layer 128.

The external connectors 130 can be attached to a package substrate. The package substrate may further be attached to, e.g., a printed circuit board (PCB) to attach the package substrate (and hence, the multi-chip device) to the PCB. Various other components can be included in a multi-chip device. For example, an interposer, an encapsulant (such as a molding compound, MUF, or the like), etc. can be included in the multi-chip device. A person having ordinary skill in the art will readily envision various modifications that can be made to the multi-chip device.

Figure 2:
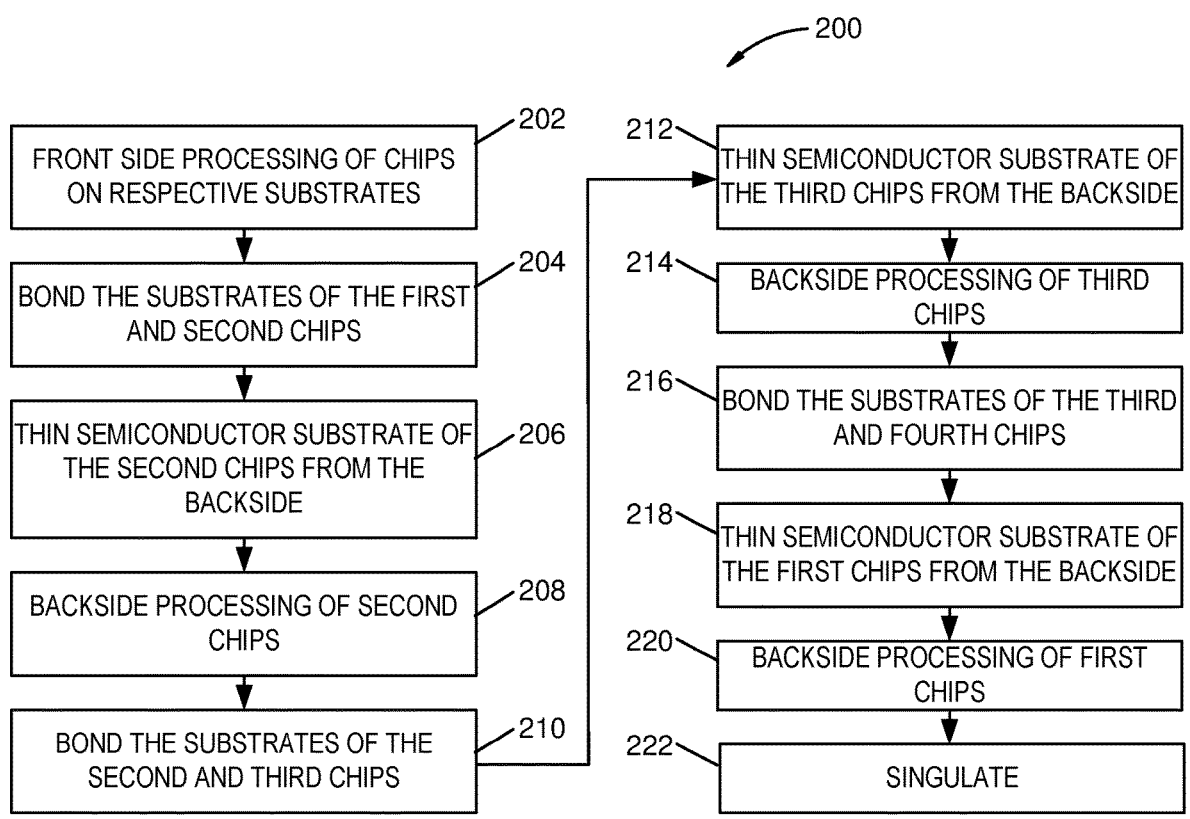
FIG. 2 is a flowchart of a method of forming the multi-chip device of FIG. 1 according to some examples.

FIG. 2 is a flowchart of a method 200 of forming the multi-chip device of FIG. 1. The processing of the method of FIG. 2 is generally described, and a person having ordinary skill in the art will readily understand the more specific processing that can be performed. The more specific processing can be according to any semiconductor processing for forming an integrated circuit on substrate, which is to be singulated into a chip.

At block 202, front side processing of the chips on the respective substrates (e.g., wafers) is performed. For example, front side processing of each semiconductor substrate 112 (e.g., wafer) can include forming devices (e.g., transistors 118) in and/or on the front surface of the semiconductor substrate 112, and forming front side dielectric layer(s) 114 with metallizations and front side bond pads 122 on the front surface of the semiconductor substrate 112. Multiple first chips 102 can be formed on a first substrate. Multiple second chips 104 can be formed on a second substrate. Multiple third chips 106 can be formed on a third substrate. Multiple fourth chips 108 can be formed on a fourth substrate.

At block 204, the respective substrates of the first chips and second chips (e.g., the first substrate and the second substrate) are bonded together, such as front side to front side bonding as shown in FIG. 1. The bonding can be at the substrate (e.g., wafer) level. The bonding can be hybrid bonding, such as bonding front side bond pads 122 of the first substrate to front side bond pads 122 of the second substrate, and bonding the exterior surface of the front side dielectric layer(s) 114 of the first substrate to the exterior surface of the front side dielectric layer(s) 114 of the second substrate.

At block 206, the semiconductor substrate 112 of the second chips (e.g., the semiconductor substrate 112 of the second substrate) is thinned from the backside. The thinning can be by a chemical mechanical polish (CMP) or other appropriate process. At block 208, backside processing of the second chips on the second substrate is performed. The backside processing can include forming backside TSVs 120 through the semiconductor substrate 112 of the second substrate and connecting to metallization in the front side dielectric layer(s) 114 of the second substrate. The backside processing can further include forming backside dielectric layer(s) 116 with metallizations and backside bond pads 124 on the back surface of the semiconductor substrate 112. The metallizations in the backside dielectric layer(s) 116 can be connected to the metallizations in the front side dielectric layer(s) 114 of the second substrate through the backside TSVs 120.

At block 210, the respective substrates of the second chips and third chips (e.g., the second substrate and the third substrate) are bonded together, such as backside (of the second substrate) to front side (of the third substrate) bonding as shown in FIG. 1. The bonding can be at the substrate (e.g., wafer) level. The bonding can be hybrid bonding, such as bonding backside bond pads 124 of the second substrate to front side bond pads 122 of the third substrate, and bonding the exterior surface of the backside dielectric layer(s) 116 of the second substrate to the exterior surface of the front side dielectric layer(s) 114 of the third substrate.

At block 212, the semiconductor substrate 112 of the third chips (e.g., the semiconductor substrate 112 of the third substrate) is thinned from the backside, like block 206. At block 214, backside processing of the third chips on the third substrate is performed, like block 208. At block 216, the respective substrates of the third chips and fourth chips (e.g., the third substrate and the fourth substrate) are bonded together, such as backside (of the third substrate) to front side (of the fourth substrate) bonding as shown in FIG. 1, like block 210.

At block 218, the semiconductor substrate 112 of the first chips (e.g., the semiconductor substrate 112 of the first substrate) is thinned from the backside, like block 206. At block 220, backside processing of the first chip on the first substrate is performed, like block 208. The backside processing of the first chip can further include forming the exterior connector bond pads 126, passivation layer 128, and external connectors 130. At block 222, the bonded substrates are singulated (e.g., by sawing) to separate individual multi-chip devices that have been formed. Each of the multi-chip devices can be as shown in FIG. 1.

According to some examples, multiple ones of the chips 102-108 have a same integrated circuit (IC) (e.g., same processing IC) formed on the respective chip 102-108. Accordingly, those multiple ones of the chips 102-108 can, in some instances, form a larger, collective IC than each chip individually, and/or one or more of the chips 102-108 can, in some instances, be redundant for device recovery. For example, if the second chip 104, third chip 106, and fourth chip 108 have the same IC, any one or more of those chips can permit redundancy within the multi-chip device. For example, if one of those multiple ones of the chips 102-108 is faulty, a redundant other one of those multiple ones of the chips 102-108 can be used or activated in place of the faulty chip, e.g., by power gating, switching, and/or configuration data. Even further, even if multiple ones of the chips 102-108 do not have a same IC, the multi-chip device can be configurable to operate a subset of the functionality of the ICs of the chips 102-108 when any portion of those ICs is defective.

As an example, the first chip 102 can have an interconnect IC, and each of the chips 104-108 can have a same programmable IC. Each of the chips 102-106 include TSVs through the respective semiconductor substrates 112 of the chips 102-106 to accommodate directing signals and power vertically in the chip stack. The interconnect IC on the first chip 102 can route and direct signals and power horizontally and then vertically in the chip stack. The interconnect IC can further include various subsystems and may be a System-on-Chip (SoC). For example, the interconnect IC can include a processing system that, among other things, can control configurations or programming of the programmable ICs of the chips 104-108 (e.g., by a controller (e.g., which can include any control logic) of the processing system). Additionally, the interconnect IC can have a Network-on-Chip (NoC), input/output blocks (such as eXtreme Performance Input/Output (XPIO), multi-gigabit transceivers (MGTs), high bandwidth memory (HBM) interfaces, peripheral component interconnect express (PCIe) interfaces, cache coherent interconnect for accelerators (CCIX) interfaces, Analog-to-Digital Converters (ADC), Digital-to-Analog Converters (DAC), etc.), and/or any intellectual property (IP) hard blocks (such as memory controllers (like double data rate (DDR) memory controllers, high bandwidth memory (HBM) memory controllers, or the like), PCIe blocks, CCIX blocks, Ethernet cores, forward error correction (FEC) blocks, etc.).

The programmable ICs of the chips 104-108 can include programmable logic regions. The programmable logic regions can include programmable logic elements including configurable logic blocks (CLBs), look-up tables (LUTs), random access memory blocks (BRAM), Ultra RAMs (URAMs), input/output blocks (IOBs), digital signal processing blocks (DSPs), clock managers, and/or delay lock loops (DLLs). In some architectures, the programmable logic regions can include columns of programmable logic elements, where each column includes a single type of programmable logic element (e.g., a column of CLBs, a column of BRAMs, etc.). The programmable logic elements can have one or more associated programmable interconnect elements. For example, in some architectures, the programmable logic regions include a column of programmable interconnect elements associated with and neighboring each column of programmable logic elements. In such examples, each programmable interconnect element is connected to an associated programmable logic element in a neighboring column and is connected to neighboring programmable interconnect elements within the same column. The interconnected columns of programmable interconnect elements can form a global routing network within the programmable logic region. In some examples, the programmable ICs can include a controller (with boot read-only memory (ROM)) and a NoC. The controller can read the ROM to configure the respective programmable IC to a base configuration that permits the programmable IC to receive configuration data, e.g., from the interconnect IC of the first chip 102 for a system-level configuration.

According to some examples, if one or more chip, or a portion thereof, is defective, the multi-chip device may still be operable by deactivating any chip, or portion thereof, that is defective and by operating the remaining chips or portions. For example, when multiple chips in the multi-chip device each have a programmable logic region, and when any programmable logic region is defective or faulty, the entire programmable logic region of that chip can be deactivated, while the programmable logic regions of the other chips can be operable. In some examples, when multiple chips in the multi-chip device each have a programmable logic region, and when a portion of any programmable logic region is defective or faulty, that portion of the programmable logic region of that chip can be deactivated, while the programmable logic regions of the other chips and remaining portion(s) of the programmable logic region of that chip can be operable.

Figure 3:
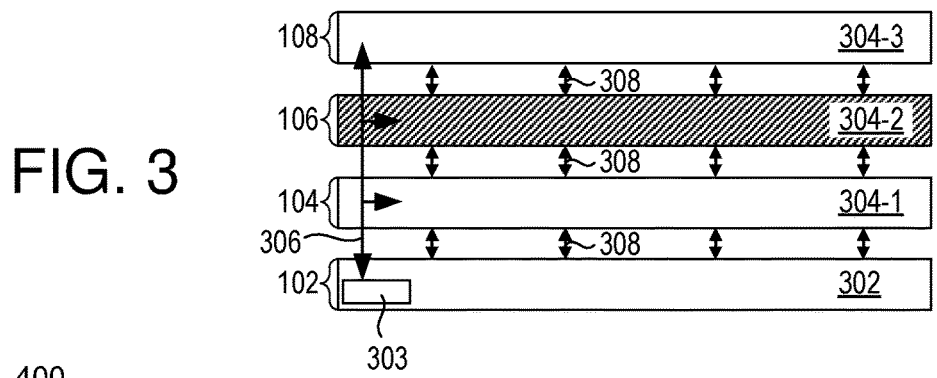
FIG. 3 is a schematic depiction of deactivating a programmable logic region of a chip in a multi-chip device according to some examples.

FIG. 3 is a schematic depiction of deactivating a programmable logic region of a chip in a multi-chip device according to some examples. The first chip 102 includes an interconnect 302. The second chip 104, the third chip 106, and the fourth chip 108 include programmable logic regions 304-1, 304-2, 304-3, respectively (individually or collectively, programmable logic region(s) 304). The interconnect 302 includes a controller 303 (e.g., of a processing system) and is communicatively connected to each of the programmable logic regions 304 by a programming interconnect 306 (e.g., a configuration frame (CFRAME) interconnect). For example, the controller 303 can communicate configuration data to each of the programmable logic regions 304 via the programming interconnect 306. In some examples, each of the chips 102-108, or any subset thereof, can include a controller such that control of the communicating configuration data can be distributed throughout the multi-chip device. Each of the chips 102-108 is communicatively connected to neighboring chips via connections 308.

In FIG. 3, the programmable logic region 304-2 of the third chip 106 is illustrated as being defective or faulty. In other examples, any of the programmable logic region(s) 304 can be defective or faulty. After forming the multi-chip device (such as the processing in FIG. 2), the multi-chip device can be tested for functionality to identify, e.g., if any of the programmable logic regions 304 is defective or faulty. If a sufficient number of programmable logic regions 304 are functional (e.g., not defective or not faulty), the multi-chip device can be operated as including a number of programmable logic regions 304 that are functional. The controller 303 in the first chip 102 can include memory (such as eFuses) that can be programmed to indicate which programmable logic regions 304 are functional and/or are faulty or defective. The controller 303 can responsively distribute configuration data to the functional programmable logic regions 304 via the programming interconnect 306 based on the programmed memory. Additionally, power gating may be implemented using the controller 303 to reduce or eliminate power consumption by the programmable logic region 304 and/or corresponding chip that is faulty or defective. In this example, an entirety of the defective chip, or an entirety of a defective programmable logic region 304 of a chip is deactivated, while an entirety of a functional programmable logic region 304 remains operable.

In the context of a programmable logic device (e.g., FPGA) implemented by a multi-chip device as described, a user design can be implemented in the programmable logic regions 304. Which programmable logic regions 304 are functional or are faulty or defective is transparent to the user design. For example, in the context of FIG. 3, the multi-chip device can implement the user design in two programmable logic regions 304 (e.g., programmable logic regions 304-1, 304-3) as if those two programmable logic regions 304 are adjacent in the chip stack of the multi-chip device (e.g., as if the programmable logic regions 304 are in the second chip 104 and third chip 106, respectively). The controller 303 of the first chip 102 is configured to distribute the configuration data for the programmable logic regions 304 to accommodate the intermediate defective programmable logic region 304-2 without the user design being aware of the intermediate defective programmable logic region 304-2.

Figure 4:
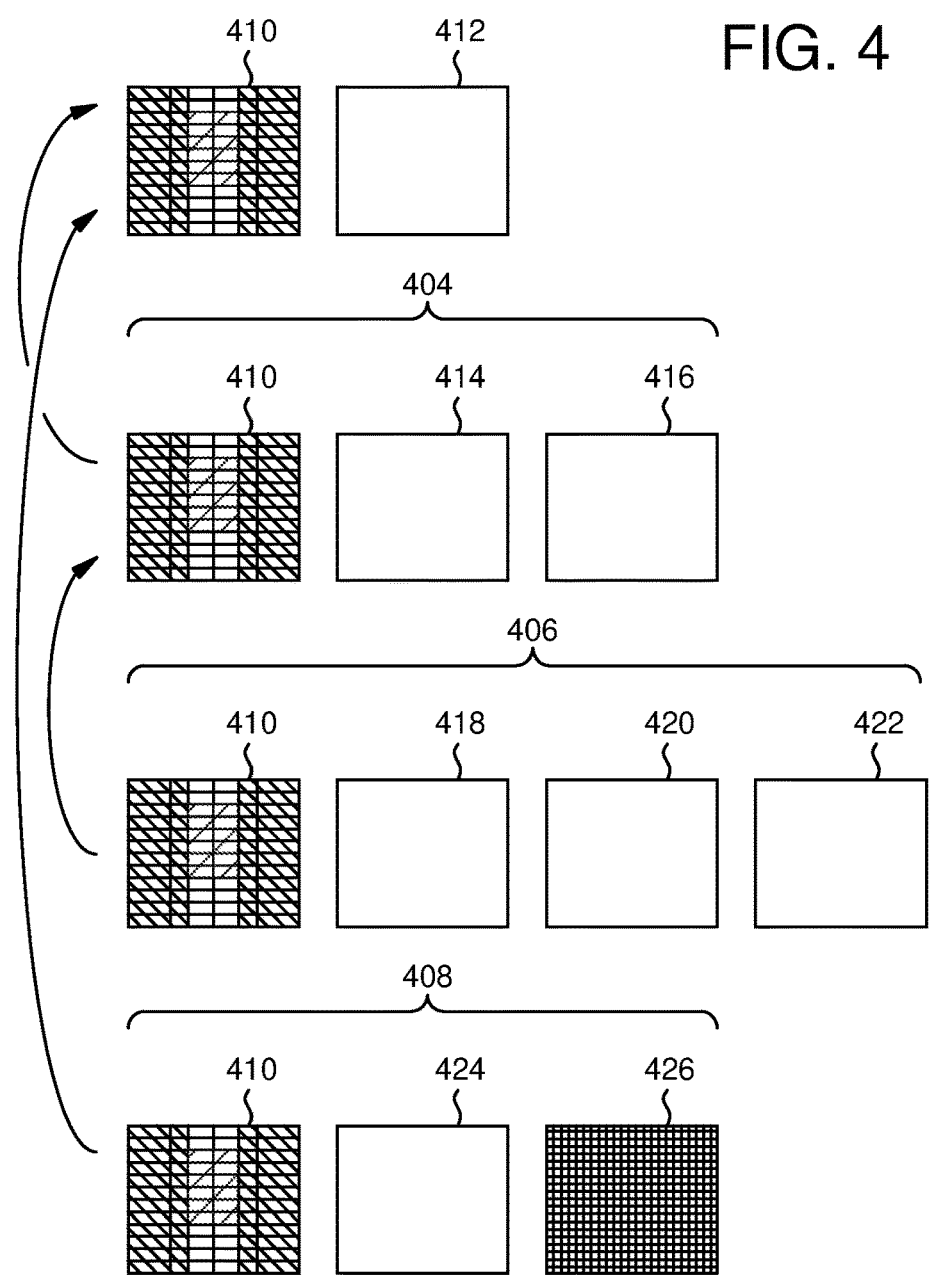
FIG. 4 is a representation of a number of example multi-chip device specifications, which may permit a recovery scheme according to some examples.

FIG. 4 is a representation 400 of a number of example multi-chip device specifications, which may permit a recovery scheme according to some examples. FIG. 4 illustrates four device specifications 402, 404 406, 408 of multi-chip devices. The device specifications 402-408 are illustrated in a single plane for ease of depiction, but can be configured in a multi-chip device as generally shown in FIG. 1 (albeit possibly with different numbers of chips).

As illustrated, the device specifications 402-408 include a base chip 410 that is the same across the different specifications. The base chip 410 can be, for example, the first chip 102 of FIG. 1 and can include, e.g., the interconnect 302 and controller 303 described with respect to FIG. 3. The device specification 402 includes a single fabric chip 412. The fabric chip 412 can be any of the second chip 104, third chip 106, and fourth chip 108 of FIG. 1 and can include, e.g., a programmable logic region 304 described with respect to FIG. 3. The device specification 404 includes two fabric chips 414, 416. The fabric chips 414, 416 can be any of the second chip 104, third chip 106, and fourth chip 108 of FIG. 1 and each can include, e.g., a programmable logic region 304 described with respect to FIG. 3. The device specification 406 includes three fabric chips 418, 420, 422. The fabric chips 418, 420, 422 can be any of the second chip 104, third chip 106, and fourth chip 108 of FIG. 1 and each can include, e.g., a programmable logic region 304 described with respect to FIG. 3. The device specification 408 includes one fabric chip 424 and an accelerator chip 426 (e.g., different from the fabric chip 424). The fabric chip 424 can be any of the second chip 104 and third chip 106 of FIG. 1 and can include, e.g., a programmable logic region 304 described with respect to FIG. 3. The accelerator chip 426 is physically above the fabric chip 424 in the multi-chip device, and can be the third chip 106 or fourth chip 108 of FIG. 1. The fabric chips 412-424 each have the same integrated circuit.

A multi-chip device manufactured according to a given device specification includes the chips of that specification stacked sequentially. For example, a multi-chip device manufactured according to the device specification 402 has a first chip (e.g., the base chip 410) and a second chip (e.g., the fabric chip 412) stacked on the first chip without any other chip. For example, a multi-chip device manufactured according to the device specification 404 has a first chip (e.g., the base chip 410), a second chip (e.g., the fabric chip 414) stacked on the first chip, and a third chip (e.g., the fabric chip 416) stacked on the second chip, without any other chip. As a further example, a multi-chip device manufactured according to the device specification 406 has a first chip (e.g., the base chip 410), a second chip (e.g., the fabric chip 418) stacked on the first chip, a third chip (e.g., the fabric chip 420) stacked on the second chip, and a fourth chip (e.g., the fabric chip 422) stacked on the third chip, without any other chip.

Suppose a multi-chip device is manufactured according to the device specification 408 (e.g., in the context of FIG. 1, such that the first chip 102 is the base chip 410, the second chip 104 is the fabric chip 424, and the third chip 106 is the accelerator chip 426). If the accelerator chip 426 is defective or faulty, and is not operable, and the base chip 410 and fabric chip 424 are operable, the multi-chip device can implement the device specification 402 having the base chip 410 and a single fabric chip 412 (e.g., a single layer of a programmable logic region or fabric).

Suppose a multi-chip device is manufactured according to the device specification 406 (e.g., in the context of FIG. 1, such that the first chip 102 is the base chip 410, and the second chip 104, third chip 106, and fourth chip 108 are the fabric chips 418, 420, 422, respectively). If one of the fabric chips 418, 420, 422 is defective or faulty, and is not operable, and the base chip 410 and two of the fabric chips 418, 420, 422 are operable, the multi-chip device can implement the device specification 404 having the base chip 410 and two fabric chips 414, 416 (e.g., two layers of a programmable logic region or fabric). If two of the fabric chips 418, 420, 422 are defective or faulty, and are not operable, and the base chip 410 and one of the fabric chips 418, 420, 422 are operable, the multi-chip device can implement the device specification 402 having the base chip 410 and a single fabric chip 412 (e.g., a single layer of a programmable logic region or fabric).

Suppose a multi-chip device is manufactured according to the device specification 404 (e.g., in the context of FIG. 1, such that the first chip 102 is the base chip 410, and the second chip 104 and third chip 106 are the fabric chips 414, 416, respectively, with no fourth chip 108). If one of the fabric chips 414, 416 is defective or faulty, and is not operable, and the base chip 410 and the other of the fabric chips 414, 416 is operable, the multi-chip device can implement the device specification 402 having the base chip 410 and a single fabric chip 412 (e.g., a single layer of a programmable logic region or fabric).

The above examples illustrate how a multi-chip device manufactured according to one device specification can realize or be operable according to another device specification when a chip is faulty or defective. The multi-chip device can be configured to logically implement the device specification that the multi-chip device is capable of meeting, and that logical configuration is transparent to the user and user design. For example, if a user design is to be implemented on a multi-chip device that meets the device specification 404, whether the multi-chip device was manufactured according to the device specification 404 or the device specification 406 (with one of the fabric chips 418, 420, 422 being faulty or defective) is unknown and transparent to the user design, and the user design is implemented functionally identical in either instance. The logical implementation can be based on configuration data stored in memory in the base chip 410, which can determine how a controller in the base chip 410 distributes configuration data to the corresponding fabric chips.

In some examples, the architecture of the different multi-chip devices are similar enough in terms of connectivity, delay, and power such that metrics are virtually identical, which may permit multi-chip devices having different physical components (e.g., different numbers of chips) to meet a same device specification. In some examples, the multi-chip devices comprise chip-to-chip connections that allows a signal to optionally pass through a chip when inactive with only a small delay overhead, e.g., through a TSV. In some examples, the multi-chip devices comprise a configuration scheme to optionally send configuration data to a different layer. In some examples, the multi-chip devices comprise a timing methodology to accommodate the worst case delay through any of the possible inter-chip paths.

Figure 5:
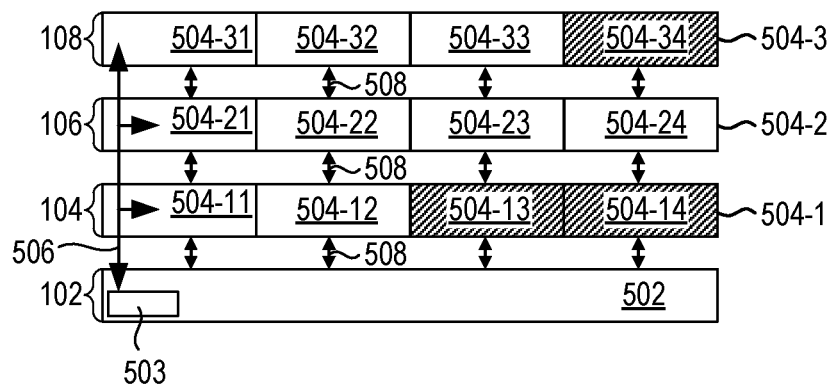
FIG. 5 is a schematic depiction of deactivating sub-regions of programmable logic region(s) of a multi-chip device according to some examples.

FIG. 5 is a schematic depiction of deactivating sub-regions of programmable logic region(s) of a multi-chip device according to some examples. The first chip 102 includes an interconnect 502. The second chip 104, the third chip 106, and the fourth chip 108 include programmable logic regions 504-1, 504-2, 504-3, respectively (individually or collectively, programmable logic region(s) 504). The interconnect 502 includes a controller 503 (e.g., of a processing system) and is communicatively connected to each of the programmable logic regions 504 by a programming interconnect 506. For example, the controller 503 can communicate configuration data to each of the programmable logic regions 504 via the programming interconnect 506. In some examples, each of the chips 102-108, or any subset thereof, can include a controller such that control of the communicating configuration data can be distributed throughout the multi-chip device. Each of the chips 102-108 is communicatively connected to neighboring chips via connections 508.

Each of the programmable logic regions 504 includes sub-regions. Programmable logic region 504-1 includes sub-regions 504-11, 504-12, 504-13, 504-14. Programmable logic region 504-2 includes sub-regions 504-21, 504-22, 504-23, 504-24. Programmable logic region 504-3 includes sub-regions 504-31, 504-32, 504-33, 504-34. The sub-regions can be physically divided and/or logically divided. Division between sub-regions may be based on any number of logical and/or physical boundaries, such as a boundary between differing clock domains, a boundary between differing voltage domains, a boundary between differing types of circuitry or logic blocks, or the like. In this example, individual sub-regions can be deactivated when that sub-region is faulty and/or when that sub-region is chosen to not be an active sub-region in the multi-chip device.

Each sub-region can communicate with other neighboring sub-regions in adjacent chips via the connections 508. The connections 508 can be passive connections that include, e.g., TSVs and metal lines and vias in front side and/or backside dielectric layers. Hence, deactivating an intervening sub-region may not affect other sub-regions from communicating with each other via the connections 508. In some examples, the sub-regions may include separate receive and drive circuitry for relaying signals via connections 508 which is unaffected when a given sub-region is deactivated. Accordingly, in some examples, not all of the circuitry in a deactivated sub-region may be unused.

In FIG. 5, the sub-regions 504-13, 504-14 of the second chip 104 and sub-region 504-34 of the fourth chip 108 are illustrated as being defective or faulty. In other examples, any of the sub-regions can be defective or faulty. After forming the multi-chip device (such as the processing in FIG. 2), the multi-chip device can be tested for functionality to identify, e.g., if any of the sub-regions of the programmable logic regions 504 are defective or faulty. If a sufficient number of sub-regions of the programmable logic regions 504 are functional (e.g., not defective or not faulty), the multi-chip device can be operated as including a number of sub-regions of the programmable logic regions 504 that are functional. The controller 503 in the first chip 102 can include memory (such as eFuses) that can be programmed to indicate which sub-regions of the programmable logic regions 504 are functional and/or are faulty or defective. The controller 503 can responsively distribute configuration data to the functional programmable logic regions 304 via the programming interconnect 506 based on the programmed memory. Additionally, power gating may be implemented using the controller 503 to reduce or eliminate power consumption by the sub-region of the programmable logic region 504 that is faulty or defective.

In the illustrated example of FIG. 5, the multi-chip device can be operated as including, e.g., two programmable logic regions 504, which can be distributed across the chips 104-108. Any number of sub-regions can be functional on any of the chips 104-108 to permit the multi-chip device to meet a device specification, such as described above with respect to FIG. 4 with more granularity for the sub-regions. A person having ordinary skill in the art will readily understand the additional level of granularity.

In the context of a programmable logic device (e.g., FPGA) implemented by a multi-chip device as described, a user design can be implemented in the programmable logic regions 504. Which sub-regions of the programmable logic regions 504 are functional or are faulty or defective is transparent to the user design. For example, in the context of FIG. 5, the multi-chip device can implement the user design in eight sub-regions (e.g., equivalent to two full programmable logic regions 504) (e.g., using sub-regions 504-11, 504-12, 504-21, 504-22, 504-23, 504-24, 504-31, 504-32) as if those sub-regions of programmable logic regions 504 are adjacent in the chip stack of the multi-chip device. In the illustrated example, respective halves of the programmable logic regions 504-1, 504-3, irrespective of alignment (logical or physical) of functional sub-regions, can be implemented to form a logical layer of a programmable logic region. As described, half of the programmable logic region 504-1 includes sub-regions 504-11, 504-12, and half of the programmable logic region 504-3 can include any two of sub-regions 504-31, 504-32, 504-33. Different numbers of sub-regions per any programmable logic region 504 can be combined to form a layer of a programmable logic region. The controller 503 of the first chip 102 is configured to distribute the configuration data for the sub-regions of the programmable logic regions 504 to accommodate for any intermediate defective sub-region of a programmable logic region 504 without the user design being aware of the intermediate defective sub-region of the programmable logic region 504.

In the above description of FIG. 5, sub-regions can be implemented to form an integer number of logical, complete programmable logic regions 504. In other examples, a multi-chip device can implement any combination of partial programmable logic regions 504, e.g., without regard to implementing an integer number of logical, complete programmable logic regions. 504. For example, in the illustrated example of FIG. 5, a first layer can be implemented as a half layer comprising sub-regions 504-11, 504-12; a second layer can be implemented as a complete layer of programmable logic region 504-2; and a third layer can be implemented as a three-quarter layer comprising sub-regions 504-31, 504-32, 504-33.

Figure 6:
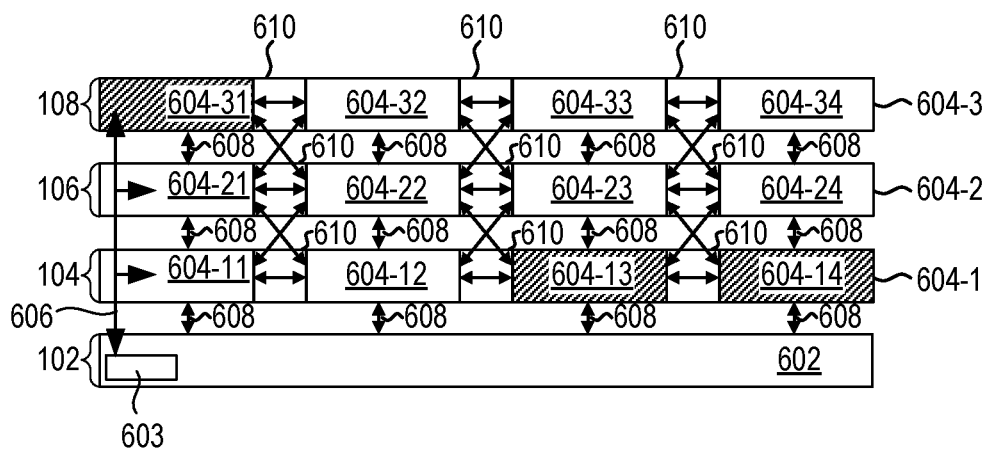
FIG. 6 is a schematic depiction of deactivating sub-regions of programmable logic region(s) of a multi-chip device according to some examples.

FIG. 6 is a schematic depiction of deactivating sub-regions of programmable logic region(s) of a multi-chip device according to some examples. The first chip 102 includes an interconnect 602. The second chip 104, the third chip 106, and the fourth chip 108 include programmable logic regions 604-1, 604-2, 604-3, respectively (individually or collectively, programmable logic region(s) 604). The interconnect 602 includes a controller 603 (e.g., of a processing system) and is communicatively connected to each of the programmable logic regions 604 by a programming interconnect 606. For example, the controller 603 can communicate configuration data to each of the programmable logic regions 604 via the programming interconnect 606. In some examples, each of the chips 102-108, or any subset thereof, can include a controller such that control of the communicating configuration data can be distributed throughout the multi-chip device. Each of the chips 102-108 is communicatively connected to neighboring chips via connections 608.

Each of the programmable logic regions 604 includes sub-regions. Programmable logic region 604-1 includes sub-regions 604-11, 604-12, 604-13, 604-14. Programmable logic region 604-2 includes sub-regions 604-21, 604-22, 604-23, 604-24. Programmable logic region 604-3 includes sub-regions 604-31, 604-32, 604-33, 604-34. The sub-regions can be physically divided and/or logically divided. Division between sub-regions may be based on any number of logical and/or physical boundaries, such as a boundary between differing clock domains, a boundary between differing voltage domains, a boundary between differing types of circuitry or logic blocks, or the like.

In this example, individual sub-regions can be deactivated when that sub-region is faulty and/or when that sub-region is chosen to not be an active sub-region in the multi-chip device. Sub-regions that align logically and/or physically across the chips 104-108 can form a sliver. Each sub-region in a sliver is the same and/or functionally equivalent to the other sub-regions in that sliver. Sub-regions in different slivers may have different circuitry and/or functionality. In operation, one or more sub-region of a sliver can be deactivated. For example, if one sub-region in a sliver is faulty, that sub-region is deactivated, while other sub-regions in the sliver are activated and operable. Further, for example, if no sub-region in a sliver is faulty, any sub-region in that sliver can be chosen to be deactivated, while other sub-regions in the sliver are activated and operable.

In the context of the illustrated example, four slivers are in the multi-chip device. A first sliver includes sub-regions 604-11, 604-21, 604-31. A second sliver includes sub-regions 604-12, 604-22, 604-32. A third sliver includes sub-regions 604-13, 604-23, 604-33. A fourth sliver includes sub-regions 604-14, 604-24, 604-34. In some examples, as long as a sufficient number of sub-regions in each sliver is not faulty, the multi-chip device can be operated as logically including up to three programmable logic chips (e.g., fabric chips). For example, if sub-regions 604-31, 604-13, 604-14 are faulty and/or deactivated, sub-regions 604-11, 604-21 can be operated in the first sliver; sub-regions 604-12, 604-22 can be operated in the second sliver; sub-regions 604-23, 604-33 can be operated in the third sliver; and sub-regions 604-24, 604-34 can be operated in the fourth sliver.

Each sub-region within a sliver can communicate with other sub-regions within that sliver via connections 608. The connections 608 can be passive connections that include, e.g., TSVs and metal lines and vias in front side and/or backside dielectric layers. Hence, deactivating an intervening sub-region in a sliver may not affect other sub-regions within that sliver from communicating with each other via the connections 608. In some examples, the sub-regions in a sliver may include separate receive and drive circuitry for relaying signals via connections 608 which is unaffected when a given sub-region in the sliver is deactivated. For example, if the sub-region 604-13 is deactivated, the driver and receiver circuitry for the connections 608 through the sub-region 604-13 may still be operational so that the sub-regions 604-23, 604-33 can communicate via the connections 608. Accordingly, in some examples, not all of the circuitry in a deactivated sub-region may be unused.

Inter-chip bridges 610 are disposed at boundaries between sub-regions that enable a respective sub-region to selectively communicate with a sub-region in a neighboring sliver. Via inter-chip bridges 610, each sub-region can communicate with another sub-region that is in a sliver neighboring the respective sub-region and that is in the same chip as the respective sub-region or in a chip neighboring the chip in which the respective sub-region is disposed. For example, via inter-chip bridges 610, sub-region 604-22 in the second sliver is capable of communicating with one or more of sub-regions 604-11, 604-21, 604-31 in the first sliver, and via other inter-chip bridges 610, sub-region 604-22 in the second sliver is capable of communicating with one or more of sub-regions 604-13, 604-23, 604-33 in the third sliver. In some examples, where multiple redundant physical chips are included in a multi-chip device, the inter-chip bridges may permit selective communication between sub-regions that are on chips with one or more other chips intervening between the sub-regions.

As an example, assume sub-regions 604-31, 604-13, 604-14 are faulty and/or deactivated. Sub-regions 604-11, 604-12, 604-23, 604-24 can communicate via respective inter-chip bridges 610 and can be operated as a first logical die. Sub-regions 604-21, 604-22, 604-33, 604-34 can communicate via respective inter-chip bridges 610 and can be operated as a second logical die. Under such circumstances, the chips 104-108 operate as a logical two fabric chip multi-chip device. These features can be extended to multi-chip device with different number of physical chips and logical dies.

The inter-chip bridges 610 include active devices (e.g., including transistors) on the respective semiconductor substrate of the chip, TSVs in the semiconductor substrate, and metallizations in the chip. A person having ordinary skill in the art will readily understand such components that can be implemented in an inter-chip bridge 610.

In some examples, inter-chip bridges like the inter-chip bridges 610 of FIG. 6 can be implemented in the above described example of FIG. 5 to provide additional connectivity and/or flexibility. The inter-chip bridges can be implemented between sub-regions of programmable logic regions 504 in FIG. 5 like shown in and described with respect to sub-regions of programmable logic regions 604 in FIG. 6.

Figure 7:
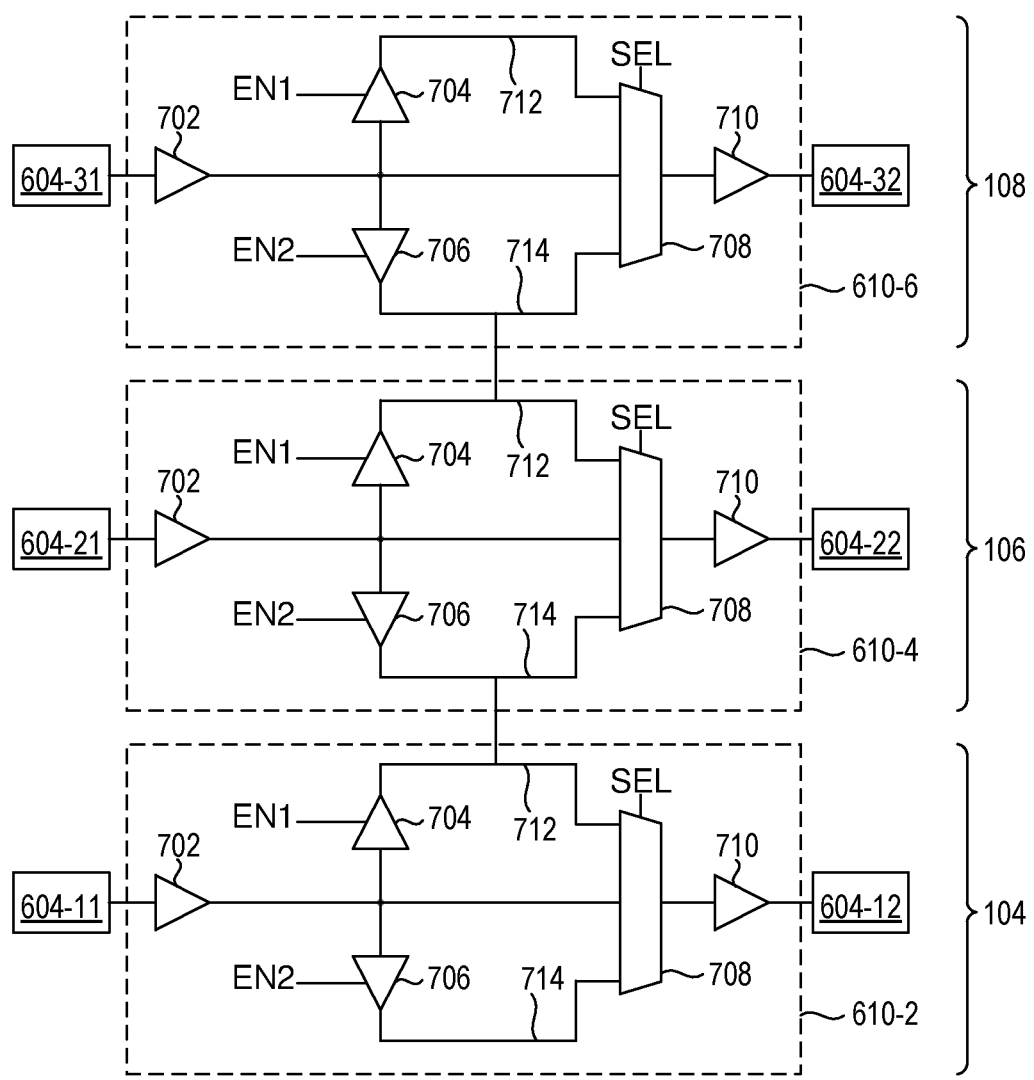
FIG. 7 illustrates a circuit schematic of inter-chip bridges on chips and between slivers according to some examples.

FIG. 7 illustrates a circuit schematic of inter-chip bridges 610-2, 610-4, 610-6 on chips 104, 106, 108, respectively, and between the first sliver and second sliver according to some examples. The inter-chip bridges 610 illustrated in FIG. 7 are shown as unidirectional (e.g., from the first sliver to the second sliver). A similar circuit schematic can additionally be implemented to permit bi-directional communication between the slivers (e.g., adding another unidirectional circuit from the second sliver to the first sliver). A person having ordinary skill in the art will readily understand such additions and that any number of circuits can be implemented as an inter-chip bridge 610 to enable communications.

Each of the inter-chip bridges 610-2, 610-4, 610-6 (individually or collectively, inter-chip bridge(s) 610) include a driver 702, tri-state drivers 704, 706, a multiplexer 708, and a driver 710. An input node of the driver 702 is connected to an output node of a respective sub-region 604-11, 604-21, 604-31 in the first sliver and on the same chip 104-108 as the inter-chip bridge 610. An output node of the driver 702 is connected to respective input nodes of the tri-state drivers 704, 706 and multiplexer 708. Respective output nodes of the tri-state drivers 704, 706 are connected to a first node 712 and a second node 714, which are further connected to respective input nodes of the multiplexer 708. An output node of the multiplexer 708 is connected to an input node of the driver 710, and an output node of the driver 710 is connected to an input node of a respective sub-region 604-12, 604-22, 604-32 in the second sliver and on the same chip 104-108 as the inter-chip bridge 610. Additionally, the first node 712 in an inter-chip bridge 610 of a chip is connected to the second node 714 in an inter-chip bridge 610 of an overlying, neighboring chip, e.g., via TSVs of one or both chips. For example, the first node 712 in the chip 104 is connected to the second node 714 in the chip 106, and the first node 712 in the chip 106 is connected to the second node 714 in the chip 108.

The tri-state drivers 704, 706 are controlled by respective enable signals EN1, EN2. For example, when the enable signals EN1, EN2 are asserted, the signal on the output node of the respective tri-state driver 704, 706 follows or corresponds to the signal in the input node of the tri-state driver 704, 706, and when the enable signals are not asserted, the impedance at the output node of the respective tri-state driver 704, 706 is in a high impedance output state. The multiplexer 708 is controlled by a select signal SEL to responsively output a signal that is input to the multiplexer 708 on one of the input nodes of the multiplexer 708.

Different examples illustrating communication to the sub-region 604-22 are described to illustrate different configurations of inter-chip bridges 610. A person having ordinary skill in the art will readily understand how these configurations can be applied for other inter-chip bridges 610 and/or for communication between other sub-regions.

In a first example, sub-region 604-11 communicates with sub-region 604-22. In such an example, the sub-region 604-12 may be deactivated. The sub-region 604-11 outputs a signal (e.g., data) to the driver 702 in inter-chip bridge 610-2, and the driver 702 outputs the signal to the tri-state drivers 704, 706 and multiplexer 708 of the inter-chip bridge 610-2. The enable signal EN1 in the inter-chip bridge 610-2 causes the tri-state driver 704 in the inter-chip bridge 610-2 to output the signal on the first node 712 of the inter-chip bridge 610-2, and thus, to the second node 714 of the inter-chip bridge 610-4. The enable signal EN2 in the inter-chip bridge 610-2 causes the tri-state driver 706 in the inter-chip bridge 610-2 to be in a high impedance output state. The select signal SEL in the inter-chip bridge 610-2 causes the multiplexer 708 in the inter-chip bridge 610-2 to output a signal on the second node 714 in the inter-chip bridge 610-2. With the tri-state driver 706 in the inter-chip bridge 610-2 having a high impedance output state, no signal or a signal from an underlying chip can be on the second node 714 in the inter-chip bridge 610-2, which can be propagated to sub-region 604-12.

The enable signal EN2 in the inter-chip bridge 610-4 causes the tri-state driver 706 in the inter-chip bridge 610-4 to be in a high impedance output state. The select signal SEL in the inter-chip bridge 610-4 causes the multiplexer 708 in the inter-chip bridge 610-4 to output a signal on the second node 714 in the inter-chip bridge 610-4, which is the signal output by the sub-region 604-11 via driver 702 and tri-state driver 704 in inter-chip bridge 610-2. Hence, the signal output by the sub-region 604-11 can be propagated to the sub-region 604-22.

In a second example, sub-region 604-21 communicates with sub-region 604-22. The sub-region 604-21 outputs a signal (e.g., data) to the driver 702 in inter-chip bridge 610-4, and the driver 702 outputs the signal to the tri-state drivers 704, 706 and multiplexer 708 of the inter-chip bridge 610-4. The select signal SEL in the inter-chip bridge 610-4 causes the multiplexer 708 in the inter-chip bridge 610-4 to output the signal from the driver 702 in the inter-chip bridge 610-4. Hence, the signal output by the sub-region 604-21 can be propagated to the sub-region 604-22. The enable signals EN1, EN2 in the inter-chip bridge 610-4 can cause the tri-state drivers 704, 706 in the inter-chip bridge 610-4 to be in a high impedance output state. The enable signal EN1 in the inter-chip bridge 610-2 can cause the tri-state driver 704 in the inter-chip bridge 610-2 to be in a high impedance output state. The enable signal EN2 in the inter-chip bridge 610-6 can cause the tri-state driver 706 in the inter-chip bridge 610-6 to be in a high impedance output state.

In a third example, sub-region 604-31 communicates with sub-region 604-22. In such an example, the sub-region 604-32 may be deactivated. The sub-region 604-31 outputs a signal (e.g., data) to the driver 702 in inter-chip bridge 610-6, and the driver 702 outputs the signal to the tri-state drivers 704, 706 and multiplexer 708 of the inter-chip bridge 610-6. The enable signal EN1 in the inter-chip bridge 610-6 causes the tri-state driver 704 in the inter-chip bridge 610-6 to be in a high impedance output state. The enable signal EN2 in the inter-chip bridge 610-6 causes the tri-state driver 706 in the inter-chip bridge 610-6 to output the signal on the second node 714 of the inter-chip bridge 610-6, and thus, to the first node 712 of the inter-chip bridge 610-4. The select signal SEL in the inter-chip bridge 610-6 causes the multiplexer 708 in the inter-chip bridge 610-6 to output a signal on the first node 712 in the inter-chip bridge 610-6. With the tri-state driver 704 in the inter-chip bridge 610-6 having a high impedance output, no signal or a signal from an overlying chip can be on the first node 712 in the inter-chip bridge 610-6, which can be propagated to sub-region 604-32.

The enable signal EN1 in the inter-chip bridge 610-4 causes the tri-state driver 704 in the inter-chip bridge 610-4 to be in a high impedance output state. The select signal SEL in the inter-chip bridge 610-4 causes the multiplexer 708 in the inter-chip bridge 610-4 to output a signal on the first node 712 in the inter-chip bridge 610-4, which is the signal output by the sub-region 604-31 via driver 702 and tri-state driver 706 in inter-chip bridge 610-6. Hence, the signal output by the sub-region 604-31 can be propagated to the sub-region 604-22.

Data for the enable signals EN1, EN2 and the select signals SEL can be stored in, e.g., one or more configuration registers, eFuses, and/or other storage on the respective chip 104-108. The data stored for these signals configures the inter-chip bridges 610 of the respective chip 104-108. The data can be stored after the multi-chip device is manufactured and tested. Testing can indicate any sub-regions that are faulty. If sufficient operable sub-regions remain in each sliver based on the testing results, data can be stored in, e.g., the configuration registers, eFuses, and/or other storage to configure the inter-chip bridges 610 as appropriate to permit communications between operable sub-regions. For example, eFuses can be blown to write data to the eFuses.

Figure 8:
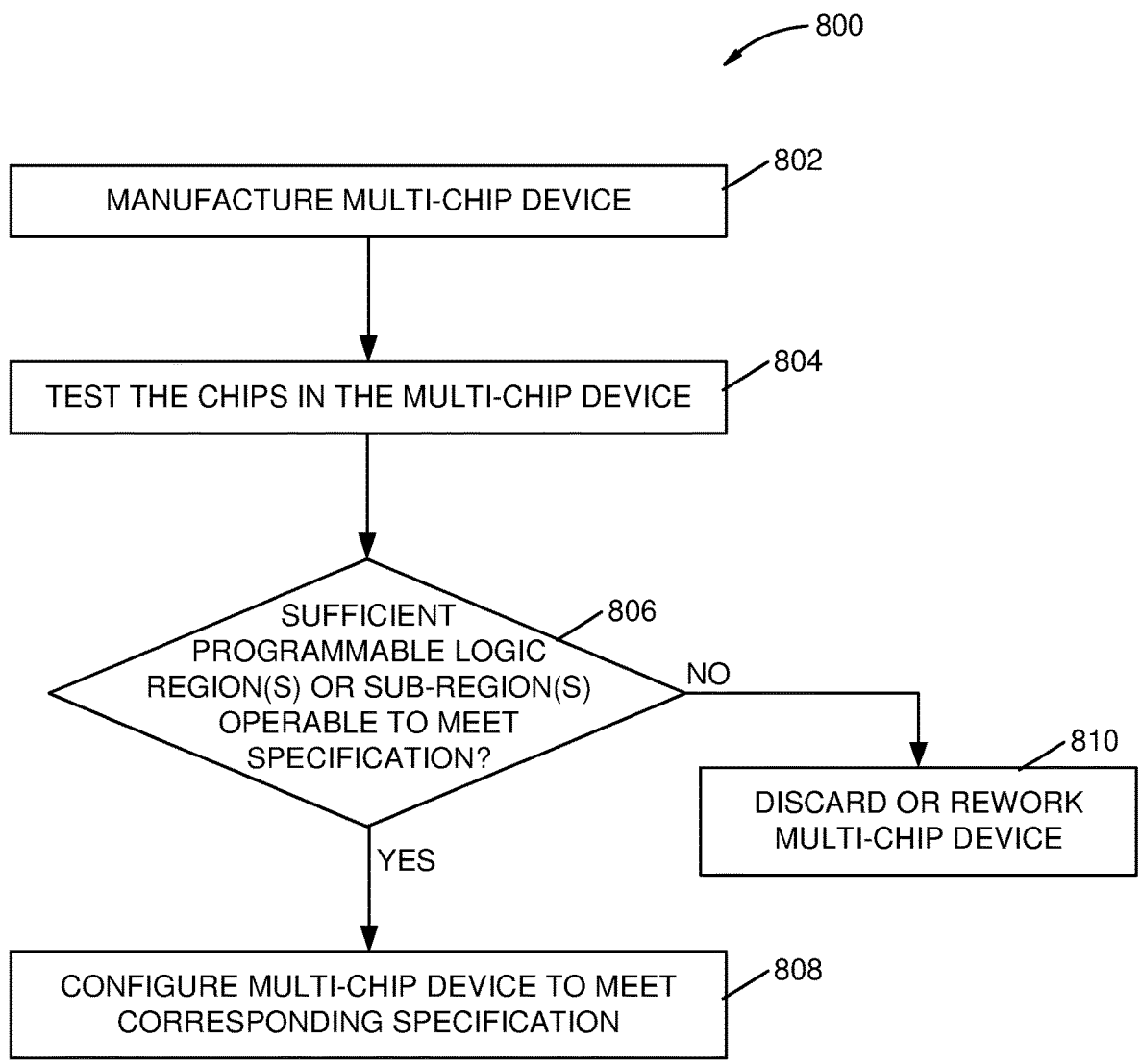
FIG. 8 is a flowchart of a method for realizing a multi-chip device according to some examples.

FIG. 8 is a flowchart of a method 800 for realizing a multi-chip device according to some examples. At block 802, a multi-chip device is manufactured according to a device specification. For example, the multi-chip device can be manufactured as described above with respect to FIG. 2.

At block 804, the chips in the multi-chip device are tested to identify nonfunctional programmable logic regions or sub-regions. At block 806, the method 800 determines whether sufficient programmable logic region(s) or sub-region(s) are operable to meet a device specification. In some examples, the determination of block 806 attempts to determine whether the multi-chip device is operable to meet a most stringent device specification first, and proceeds to determine whether the multi-chip device is operable to meet successively less stringent device specifications. For example, referring to FIG. 4, if the multi-chip device is manufactured according to the device specification 406, the determination of block 806 first determines whether the multi-chip device is operable to meet the device specification 406; if not, the determination of block 806 then determines whether the multi-chip device is operable to meet the device specification 404; and if not, the determination of block 806 then determines whether the multi-chip device is operable to meet the device specification 402. The determination can be by using a programmable logic region level analysis or a sub-region level analysis as described above.

If the multi-chip device is determined to be operable to meet a device specification at block 806, at block 808, the multi-chip device is configured to meet the corresponding device specification. More generally, the multi-chip device (e.g., the chip stack) can be configured to operate a subset of functionality of the ICs of the chips when any portion of the ICs is defective. The multi-chip device can also be configured to operate the entire functionality of the ICs of the chips when no portion of the ICs is defective. The multi-chip device can be configured by programming memory (e.g., eFuses) on any of the chips. For example, memory can be programmed in a controller of a processing system (e.g., of the first chip 102) for responsively controlling the distribution of configuration data within the multi-chip device to configure the operable programmable logic regions and/or sub-regions. In some examples, memory in the chips 104-108 can be programmed to configure inter-chip bridges to interconnect sub-regions of the programmable logic regions in appropriate layers. The configuring of block 808 can deactivate any defective or faulty chip (e.g., an entirety of the chip and/or an entirety of a programmable logic region of the chip) or portion thereof. The configuring of block 808 can activate a functional chip in its entirety and/or may activate a functional portion of a chip.

If the multi-chip device is determined to not be operable to meet a device specification at block 806, at block 810, the multi-chip device is discarded or reworked.

The redundancy in the architecture of multi-chip devices described herein can permit recovery. Generally, the more chips that are included in a chip stack of a multi-chip device manufactured according to a device specification results in a decreasing yield of such multi-chip devices that are operable according to that device specification. Additional chips generally cause additional instances of defects that can reduce yield. The recovery scheme is based on the premise that some multi-chip devices that are manufactured with some number of chips in a stack may be defective as a result of manufacturing but may be configured to be operable with a lesser number of chips in the stack.

As an example, a lot of multi-chip devices can be manufactured according to the device specification 406 (e.g., with three fabric chips 418, 420, 422). Some multi-chip devices in the lot can be defective and inoperable according to the device specification 406. However, those multi-chip devices may be able to be configured to be operable according to the device specification 404 (e.g., with two fabric chips 414, 416). Even further, some defective multi-chip devices manufactured according to the device specification 406 may be able to be configured to be operable according to the device specification 402 (e.g., with one fabric chip 412). Accordingly, multi-chip devices that are manufactured according to the device specification 406 and are defective and inoperable according to that device specification 406 may be recovered and configured to operate according to another device specification 402, 404. By considering the ability to recover some otherwise defective multi-chip devices in planning manufacturing, fewer multi-chip devices may be manufactured, and/or reduced costs can be achieved.

Assume that 1000 multi-chip devices operable according to the device specification 402 are to be realized, and that 1000 multi-chip devices operable according to the device specification 404 are to be realized. Assume further that manufacturing the device specification 402 has a yield of 90%, and that manufacturing the device specification 404 has a yield of 50%. Even further assume that each chip has a cost of 1 arbitrary unit (AU), such that a multi-chip device manufactured according to the device specification 402 has a cost of 2 AU, and that a multi-chip device manufactured according to the device specification 402 has a cost of 3 AU.

If the multi-chip devices operable according to the device specification 402 are realized independently from the multi-chip devices operable according to the device specification 404, the number of such devices that should be manufactured based on the yield is a straightforward calculation. 1111 multi-chip devices manufactured according to the device specification 402 will be manufactured to realize 1000 multi-chip devices operable according to the device specification 402 (e.g., 1111×0.9=1000), and 2000 multi-chip devices manufactured according to the device specification 404 will be manufactured to realize 1000 multi-chip devices operable according to the device specification 404 (e.g., 2000×0.5=1000). This results in a cost of 8222 AU (e.g., 1111×2+2000×3).

If the larger chip number specification, e.g., device specification 404, is considered independently, and smaller chip number specifications, e.g., device specification 402 in this example, are considered dependent upon the larger chip number specification, costs can be reduced. As with above, 2000 multi-chip devices manufactured according to the device specification 404 will be manufactured to realize 1000 multi-chip devices operable according to the device specification 404 (e.g., 2000×0.5=1000). As is apparent, multi-chip devices manufactured according to smaller chip number specifications cannot affect the number of multi-chip devices that are operable to a larger chip number specification. Assume that 40% of the defective multi-chip devices manufactured according to the device specification 404 can be recovered to be operable according to the device specification 402. 400 of the defective multi-chip devices manufactured according to the device specification 404 are recovered to be operable according to the device specification 402 (e.g., 1000×0.4=400). This results in an additional 600 multi-chip devices operable according to the device specification 402 that need to be realized. Based on the yield, 667 multi-chip devices manufactured according to the device specification 402 will be manufactured to realize 600 multi-chip devices operable according to the device specification 402 (e.g., 667×0.9=600). Under these circumstances, this results in a cost of 7334 AU (e.g., 2000×3+667×2), which is a 10.8% decrease from the 8222 AU described above.

Figure 9:
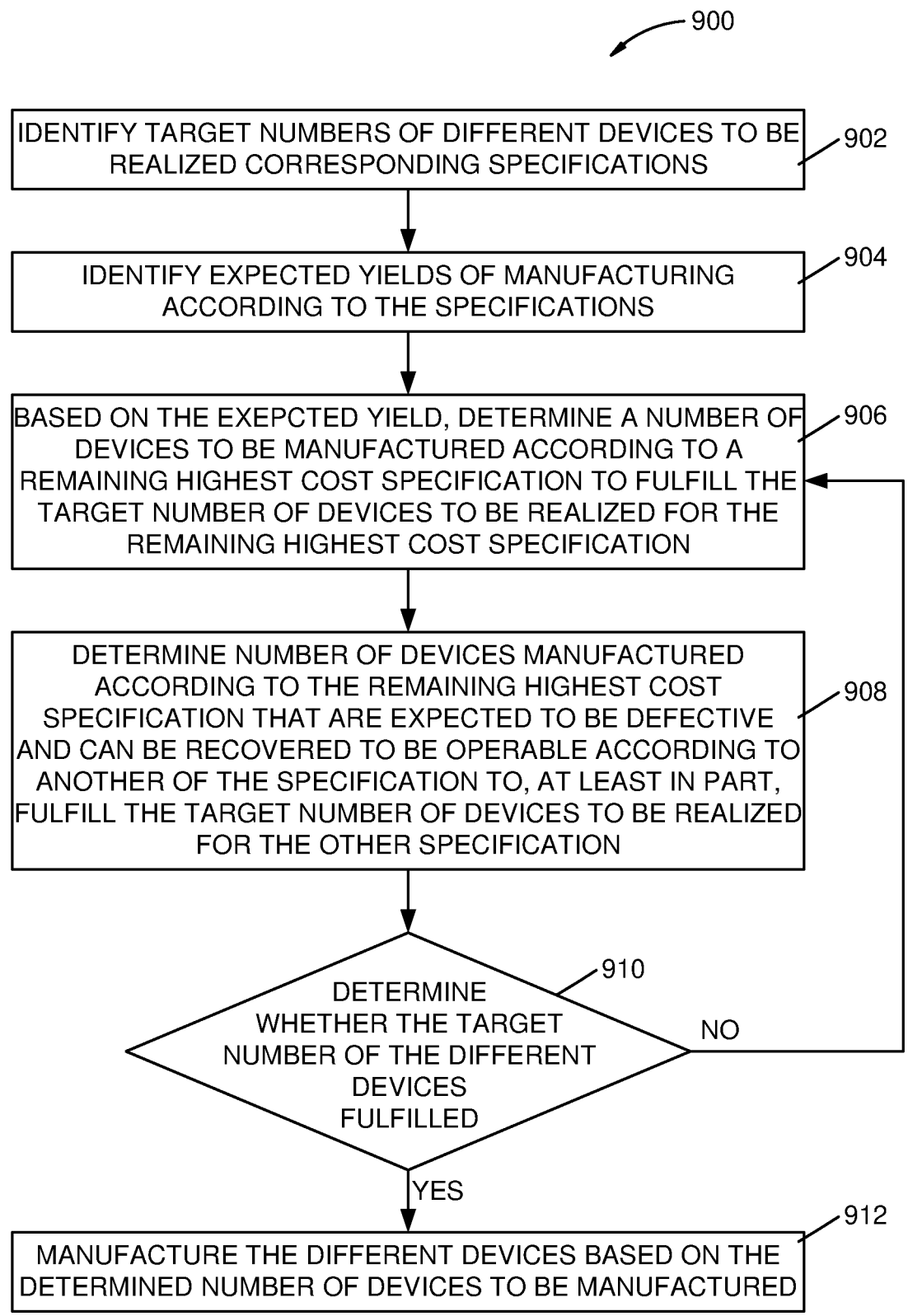
FIG. 9 is a flow chart of a method for realizing multi-chip devices according to some examples.

FIG. 9 is a flow chart of a method 900 for realizing multi-chip devices according to some examples. The example method 900 is described in the context of device specifications 402, 404, 406, and 408 to provide an illustration of various aspects of the method 900. Other example implementations of the method 900 can use different device specifications. Additionally, the method 900 may be described below in the context of defects causing a chip to be defective, and other implementations may be applied to contexts where a defect can cause a portion or sub-region of a chip to be defective with the remainder of the chip being operable.

Before beginning description of the method 900, various variables are defined to simplify the following description:

$T_A$ is the target number of multi-chip devices to be realized and operable according to a device specification A.

$C_A$ is the cost of a multi-chip device manufactured according to a device specification A.

$Y_A$ is the expected yield of manufacturing according to a device specification A.

$D_A$ is the expected number of multi-chip devices manufactured according to a device specification A that will be defective (e.g., $D_A = M_A \times (1 - Y_A)$).

$\dot{Y}_{B|A}$ is the expected yield of multi-chip devices to be recovered and operable according to a device specification B that are defective devices manufactured according to a device specification A.

$R_{B|A}$ is the number of multi-chip devices expected to be recovered and operable according to a device specification B that are defective devices manufactured according to a device specification A (e.g., $R_{B|A} = D_A \times \dot{Y}(B|A)$).

$U_B$ is the number of multi-chip devices expected to be remaining to be fulfilled to reach $T_B$, which is $U_B = T_B - (M_B \times Y_B) - \Sigma_A R_{B|A}$.

$M_B$ is the number of multi-chip devices determined to be manufactured according to a device specification B (e.g., $M_B = U_B / Y_B$).

Each $M_A$ is initialized to zero.

At block 902, target numbers of different multi-chip devices to be realized corresponding to device specifications are identified. As an example, target numbers are listed below, where the subscript identifies which of device specifications 402, 404, 406, 408 corresponds to the target number. Initially, $U_A$ is set to be equal to $T_A$.

$T_{402} = U_{402} = 1000$ $T_{404} = U_{404} = 1000$ $T_{406} = U_{406} = 1000$ $T_{408} = U_{408} = 1000$

As will become apparent, these target numbers can be achieved by manufacturing multi-chip devices according to the corresponding device specification and by manufacturing multi-chip devices according to another device specification that are recovered to be operable according to the corresponding device specification.

At block 904, the expected yields of manufacturing according to the device specifications are identified. For example, expected yields are listed below.

$Y_{402} = 90\%$ $Y_{404} = 50\%$ $Y_{406} = 30\%$ $Y_{408} = 40\%$

At block 906, based on the corresponding expected yield, a number of multi-chip devices to be manufactured according to a remaining highest cost device specification to fulfill the target number to be realized for that device specification is determined. For the purposes of the example, the costs of manufacturing multi-chip devices are listed below.

$C_{402} = 2$ AU $C_{404} = 3$ AU $C_{406} = 4$ AU $C_{408} = 3.2$ AU

In the described method 900, it is assumed that increasing number of chips generally results in increasing cost and decreasing yield. In other example implementations, another consideration, instead of or in addition to cost, can be considered for determining in which order device specifications are analyzed to determine a number of multi-chip devices to be manufactured for a corresponding device specification in block 906 and subsequent blocks and iterations.

Under these assumptions, the remaining highest cost device specification in a first instance of block 906 is the device specification 406. The number of devices to be manufactured according to the device specification 406 (e.g., identified as $M_{406}$) is 3333 (e.g., $M_{406} \times Y_{406} = U_{406} = 3333 \times 0.3 = 1000$). Hence, the target number of multi-chip devices to be realized and operable according to the device specification 406 can be fulfilled by manufacturing 3333 multi-chip devices according to the device specification 406.

At block 908, a number of multi-chip devices manufactured according to the remaining highest cost device specification that are expected to be defective and can be recovered to be operable according to another device specification to, at least in part, fulfill the target number of multi-chip devices to be realized for that other device specification is determined. Continuing the example, expected yields of multi-chip devices to be recovered and operable according to a device specification that are defective devices manufactured according to another specification are listed below.

$\dot{Y}_{402|406} = 20\%$ $\dot{Y}_{404|406} = 10\%$ $\dot{Y}_{408|406} = 0\%$

Note that in this example none of the defective multi-chip devices manufactured according to the device specification 406 can be recovered to be operable according to the device specification 408 since such defective multi-chip devices are not manufactured to include an accelerator chip 426.

Under the foregoing assumptions and circumstances, through a first pass through blocks 906 and 908, the various determined amounts are summarized as shown below.

$M_{406} = U_{406}/Y_{406} = 1000/0.3 = 3333$ $D_{406} = M_{406} \times (1 - Y_{406}) = 3333 \times (1 - 0.3) = 2333$ $R_{402|406} = D_{406} \times \dot{Y}_{402|406} = 2333 \times 0.2 = 466$ $R_{404|406} = D_{406} \times \dot{Y}_{404|406} = 2333 \times 0.1 = 233$ $R_{408|406} = D_{406} \times \dot{Y}_{408|406} = 2333 \times 0 = 0$ $U_{402} = T_{402} - (M_{402} \times Y_{402}) - \Sigma_A R_{402|A} = 1000 - (0 \times 0.9) - 466 = 534$ $U_{404} = T_{404} - (M_{404} \times Y_{404}) - \Sigma_A R_{404|A} = 1000 - (0 \times 0.5) - 233 = 767$ $U_{406} = T_{406} - (M_{406} \times Y_{406}) - \Sigma_A R_{406|A} = 1000 - (3333 \times 0.3) - 0 = 0$ $U_{408} = T_{408} - (M_{408} \times Y_{408}) - \Sigma_A R_{408|A} = 1000 - (0 \times 0.4) - 0 = 1000$ At block 910, a determination is made whether the target numbers of the different multi-chip devices have been fulfilled. If not, the method 900 loops back to block 906, and blocks 906 and 908 are iteratively performed until the target numbers of the different multi-chip devices have been fulfilled. In the illustrated example, the method 900 loops back to block 906 by operation of block 910 until $U_{402} = U_{404} = U_{406} = U_{408} = 0$. If the determination at block 910 is that the target numbers of the different multi-chip devices have been fulfilled, at block 912, the different multi-chip devices are manufactured based on the determined numbers of multi-chip devices to be manufactured. In the illustrated examples, the determined $M_{402}$, $M_{404}$, $M_{406}$, and $M_{408}$ are manufactured according to the respective device specifications 402, 404, 406, 408. The manufacturing according to a device specification can be by the method 200 of FIG. 2, for example. Any defective multi-chip devices that are to be recovered to be operable according to another device specification are configured, such as described with respect to the method 800 of FIG. 8.

In the described example, after the first pass of blocks 906 and 908, target numbers remain unfulfilled (e.g., $U_{402}$, $U_{404}$, and $U_{408}$ are not zero). Hence, a second iteration of blocks 906 and 908 is performed, and the resulting determinations and assumptions are illustrated below. The remaining highest cost specification is the device specification 408.

$\dot{Y}_{402|408} = 10\%$ $\dot{Y}_{404|408} = 0\%$

Note that in this example none of the defective multi-chip devices manufactured according to the device specification 408 can be recovered to be operable according to the device specification 404 since such defective multi-chip devices are not manufactured to include two fabric chips 414, 416.

$M_{408} = U_{408}/Y_{408} = 1000/0.4 = 2500$ $D_{408} = M_{408} \times (1 - Y_{408}) = 2500 \times (1 - 0.4) = 1500$ $R_{402|408} = D_{408} \times \dot{Y}_{402|408} = 1500 \times 0.1 = 150$ $R_{404|408} = D_{408} \times \dot{Y}_{404|408} = 1500 \times 0 = 0$ $U_{402} = T_{402} - (M_{402} \times Y_{402}) - \Sigma_A R_{402|A} = 1000 - (0 \times 0.9) - (466 + 150) = 384$ $U_{404} = T_{404} - (M_{404} \times Y_{404}) - \Sigma_A R_{404|A} = 1000 - (0 \times 0.5) - (233 + 0) = 767$ $U_{406} = T_{406} - (M_{406} \times Y_{406}) - \Sigma_A R_{406|A} = 1000 - (3333 \times 0.3) - 0 = 0$ $U_{408} = T_{408} - (M_{408} \times Y_{408}) - \Sigma_A R_{408|A} = 1000 - (2500 \times 0.4) - 0 = 0$ In the described example, after the second pass of blocks 906 and 908, target numbers remain unfulfilled (e.g., $U_{402}$ and $U_{404}$ are not zero). Hence, a third iteration of blocks 906 and 908 is performed, and the resulting determinations and assumptions are illustrated below. The remaining highest cost specification is the device specification 404.

$\dot{Y}_{402|404} = 10\%$ $M_{404} = U_{404}/Y_{404} = 767/0.5 = 1534$ $D_{404} = M_{404} \times (1 - Y_{404}) = 1534 \times (1 - 0.5) = 767$ $R_{402|404} = D_{404} \times \dot{Y}_{402|404} = 767 \times 0.1 = 76$ $U_{402} = T_{402} - (M_{402} \times Y_{402}) - \Sigma_A R_{402|A} = 1000 - (0 \times 0.9) - (466 + 150 + 76) = 308$ $U_{404} = T_{404} - (M_{404} \times Y_{404}) - \Sigma_A R_{404|A} = 1000 - (1534 \times 0.5) - (233 + 0) = 0$ $U_{406} = T_{406} - (M_{406} \times Y_{406}) - \Sigma_A R_{406|A} = 1000 - (3333 \times 0.3) - 0 = 0$ $U_{408} = T_{408} - (M_{408} \times Y_{408}) - \Sigma_A R_{408|A} = 1000 - (2500 \times 0.4) - 0 = 0$ In the described example, after the third pass of blocks 906 and 908, target numbers remain unfulfilled (e.g., $U_{402}$ is not zero). Hence, a fourth iteration of blocks 906 and 908 is performed, and the resulting determinations and assumptions are illustrated below. The remaining highest cost specification is the device specification 404.

$$M_{402}=U_{402}/Y_{402}=308/0.9=342$$

$$U_{402}=T_{402}-(M_{402}\times Y_{402})-\Sigma_A R_{402|A}=1000-(342\times 0.9)-(466+150+76)=0$$

$$U_{404}=T_{404}-(M_{404}\times Y_{404})-\Sigma_A R_{404|A}=1000-(1534\times 0.5)-(233+0)=0$$

$$U_{406}=T_{406}-(M_{406}\times Y_{406})-\Sigma_A R_{406|A}=1000-(3333\times 0.3)-0=0$$

$$U_{408}=T_{408}-(M_{408}\times Y_{408})-\Sigma_A R_{408|A}=1000-(2500\times 0.4)-0=0$$

In the described example, after the fourth pass of blocks 906 and 908, the target numbers are fulfilled, and the corresponding numbers of multi-chip devices to be manufactured according to the device specifications are manufactured. Those numbers are as listed below.

$$M_{402}=342$$

$$M_{404}=1534$$

$$M_{406}=3333$$

$$M_{408}=2500$$

Accordingly, in the described example, for the device specification 408, the target number (e.g., 1000) of multi-chip devices to be realized and operable according to the specification can be achieved by manufacturing the number of multi-chip devices determined to be manufactured (e.g., 2500), given the expected yield of manufacturing (e.g., 40%). For the device specification 406, the target number (e.g., 1000) of multi-chip devices to be realized and operable according to the specification can be achieved by manufacturing the number of multi-chip devices determined to be manufactured (e.g., 3333), given the expected yield of manufacturing (e.g., 30%). For the device specification 404, the target number (e.g., 1000) of multi-chip devices to be realized and operable according to the specification can be achieved by manufacturing the number of multi-chip devices determined to be manufactured (e.g., 1534), given the expected yield of manufacturing (e.g., 50%), and by recovering a number of defective multi-chip devices manufactured according to the device specification 406 (e.g., 233). For the device specification 402, the target number (e.g., 1000) of multi-chip devices to be realized and operable according to the specification can be achieved by manufacturing the number of multi-chip devices determined to be manufactured (e.g., 342), given the expected yield of manufacturing (e.g., 90%), and by recovering a number of defective multi-chip devices manufactured according to the device specification 408 (e.g., 150), a number of defective multi-chip devices manufactured according to the device specification 406 (e.g., 466), and a number of defective multi-chip devices manufactured according to the device specification 404 (e.g., 76).

By using the disclosed recovery scheme, a number of manufactured multi-chip devices can be recovered. Other examples can have any number of device specifications, can use any recovery mechanism, and can have any number of devices to be realized. The foregoing example is described to more clearly illustrate the described method.

The flowchart and block diagrams in the figures illustrate the architecture, functionality, and operation of possible implementations of systems and methods according to various examples. In other implementations, the functions noted in the block may occur out of the order noted in the figures. For example, two blocks shown in succession may, in fact, be executed substantially concurrently, or the blocks may sometimes be executed in the reverse order, depending upon the functionality involved. While the foregoing is directed to specific examples, other and further examples may be devised without departing from the basic scope thereof, and the scope thereof is determined by the claims that follow.

What is claimed is:

1. A multi-chip device comprising:
a chip stack comprising vertically stacked chips, wherein:
neighboring pairs of the chips are directly connected together;
the chips include a first chip and two or more second chips stacked on the first chip;
the first chip includes a controller and memory;
each of the two or more second chips includes a processing integrated circuit, the processing integrated circuit being capable of, configured to, or configurable to process or manipulate data and output resulting data;
the memory is operable to store configuration information relating to operability of the processing integrated circuits;
the controller is communicatively connected to the processing integrated circuits and is operable to distribute configuration data to the processing integrated circuits based on the configuration information; and
the chip stack is configurable based on the configuration data to operate a subset of functionality of the processing integrated circuits of the two or more second chips when any portion of the processing integrated circuits is defective.

2. The multi-chip device of claim 1, wherein:
each of the processing integrated circuits includes a programmable logic region; and
the chip stack is configurable to operate a respective entirety of the programmable logic region of fewer than the two or more second chips and to deactivate a respective entirety of the programmable logic region of at least one of the two or more second chips.

3. The multi-chip device of claim 1, wherein:
each of the processing integrated circuits includes a programmable logic region; and
the chip stack is configurable to operate any sub-region of the programmable logic regions of the two or more second chips and to deactivate any sub-region of the programmable logic regions of the two or more second chips.

4. The multi-chip device of claim 3, wherein sub-regions of the programmable logic regions of the two or more second chips are aligned in slivers, each of the slivers including a sub-region of the programmable logic region of each of the two or more second chips, the two or more second chips each comprising inter-chip bridges, each of the inter-chip bridges being connected between sub-regions of the programmable logic regions in neighboring slivers of the respective chip in which the respective inter-chip bridge is disposed and connected to a neighboring inter-chip bridge connected between sub-regions of the programmable logic regions in the neighboring slivers disposed in each respective neighboring chip.

5. The multi-chip device of claim 1, wherein:

each of the processing integrated circuits includes a programmable logic region;

the chip stack is configurable to operate a subset of the programmable logic regions when any portion of the programmable logic regions is defective;

the configuration data is operable on one or more of the programmable logic regions; and the chip stack is configurable to operate the configuration data regardless of which portions of the programmable logic regions of the chip stack is configured to operate.

6. The multi-chip device of claim 1, wherein at least one of the processing integrated circuits of the two or more second chips is different from another at least one of the processing integrated circuits of the two or more second chips.

7. The multi-chip device of claim 1, wherein two or more of the processing integrated circuits of the two or more second chips are a same processing integrated circuit.

8. The multi-chip device of claim 1, wherein:

the two or more second chips includes three or more second chips;

each of the three or more second chips includes a processing integrated circuit; and the chip stack is configurable to operate functionality of one of the processing integrated circuits when any portion of at least two of the processing integrated circuits is defective, and is configurable to operate functionality of two of the processing integrated circuits when any portion of at least one of the processing integrated circuits is defective.

9. A method for realizing a device, the method comprising:

configuring, using configuration data, a chip stack to operate a subset of functionality of a plurality of processing integrated circuits when any portion of the processing integrated circuits is defective, the chip stack comprising vertically stacked chips, neighboring pairs of the chips being directly connected together, the chip stack comprising a first chip and two or more second chips stacked on the first chip, the first chip comprising memory and a controller, each of the two or more second chips includes a respective one of the processing integrated circuits, each of the processing integrated circuits being capable of, configured to, or configurable to process or manipulate data and output resulting data, the memory stores configuration information relating to operability of the processing integrated circuits, configuring, using the configuration data, the chip stack includes distributing the configuration data from the controller to the processing integrated circuits based on the configuration information.

10. The method of claim 9, wherein configuring the chip stack includes configuring the chip stack to operate a respective entirety of a programmable logic region of fewer than the two or more second chips and to deactivate a respective entirety of a programmable logic region of at least one of the two or more second chips, each of the processing integrated circuits including a programmable logic region.

11. The method of claim 9, wherein configuring the chip stack includes configuring the chip stack to operate any sub-region of a programmable logic region of the two or more second chips and to deactivate any sub-region of a programmable logic region of the two or more second chips, each of the processing integrated circuits including a programmable logic region.

12. The method of claim 11, wherein sub-regions of the programmable logic regions of the two or more second chips are aligned in slivers, each of the slivers including a sub-region of the programmable logic region of each of the two or more second chips, the two or more second chips each comprising inter-chip bridges, each of the inter-chip bridges being connected between sub-regions of the programmable logic regions in neighboring slivers of the respective chip in which the respective inter-chip bridge is disposed and connected to a neighboring inter-chip bridge connected between sub-regions of the programmable logic regions in the neighboring slivers disposed in each respective neighboring chip.

13. The method of claim 9, wherein at least one of the processing integrated circuits of the two or more second chips is different from another at least one of the processing integrated circuits of the two or more second chips.

14. The method of claim 9, wherein two or more of the processing integrated circuits of the two or more second chips are a same processing integrated circuit.

15. A method for realizing a device, the method comprising:

testing a multi-chip device comprising a chip stack of chips, each of the chips including a processing integrated circuit, the processing integrated circuit being capable of, configured to, or configurable to process or manipulate data and output resulting data, the multi-chip device being manufactured according to a first device specification;

determining whether the multi-chip device is operable according to the first device specification or a second device specification different from the first device specification based on testing the multi-chip device; and programming the multi-chip device to be operable according to one of the first device specification and the second device specification based on the determining, wherein programming the multi-chip device is indicative of whether any portion of the processing integrated circuits of the chips is deactivated.

16. The method of claim 15, wherein programming the multi-chip device includes deactivating at least a portion of at least one of the processing integrated circuits.

17. The method of claim 15, wherein two or more of the chips includes a same processing integrated circuit comprising a programmable logic region, programming the multi-chip device includes configuring the multi-chip device to be operable using at least one entire logical programmable logic region and deactivating at least a portion of at least one of the programmable logic regions.

18. The method of claim 15, wherein two or more of the chips includes a same processing integrated circuit comprising a programmable logic region, programming the multi-chip device includes configuring the multi-chip device to be operable using the entire programmable logic region of at least one of the chips and deactivating an entire programmable logic region of at least one of the chips.

19. The method of claim 15, wherein two or more of the chips includes a same integrated circuit comprising a programmable logic region, programming the multi-chip device includes configuring the multi-chip device to be operable using at least a portion of two or more programmable logic regions of the chips and deactivating at least a portion of the programmable logic region of at least one of the chips that include the same integrated circuit.

* * * * *

UNITED STATES PATENT AND TRADEMARK OFFICE
CERTIFICATE OF CORRECTION

PATENT NO. : 10,825,772 B2  
APPLICATION NO. : 16/571788  
DATED : November 3, 2020  
INVENTOR(S) : Young et al.

Page 1 of 1

It is certified that error appears in the above-identified patent and that said Letters Patent is hereby corrected as shown below:

In the Specification

Column 20, Line 14, Delete "$\grave{Y}(B|A))$." and insert -- $\grave{Y}_{B|A}$. --, therefor.

Column 22, Line 35, Delete "$T_{402}(M_{402} \times \grave{Y}_{402})$" and insert -- $T_{402} - (M_{402} \times Y_{402})$ --, therefor.

Column 22, Line 37, Delete "$T_{404}($" and insert -- $T_{404}$ -( --, therefor.

Column 22, Line 40, Delete "$T_{406}($" and insert -- $T_{406}$ --, therefor.

Column 22, Line 42, Delete "$T_{408}($" and insert -- $T_{408} - ($ --, therefor.

Column 23, Line 12, Delete "$R_{404_1A}$" and insert -- $R_{404|A}$ --, therefor.

Column 23, Line 15, Delete "$R_{406_1A}$" and insert -- $R_{406|A}$ --, therefor.

Signed and Sealed this  
Twenty-second Day of June, 2021

Drew Hirshfeld  
*Performing the Functions and Duties of the*  
*Under Secretary of Commerce for Intellectual Property and*  
*Director of the United States Patent and Trademark Office*